United States Patent
Maheshwari

(10) Patent No.: US 7,450,409 B1
(45) Date of Patent: Nov. 11, 2008

(54) CONTENT ADDRESSABLE MEMORY (CAM) CELL HAVING COLUMN-WISE CONDITIONAL DATA PRE-WRITE

(75) Inventor: Dinesh Maheshwari, Fremont, CA (US)

(73) Assignee: Netlogic Microsystems, Inc., Mountain View, CA (US)

(*) Notice: Subject to any disclaimer, the term of this patent is extended or adjusted under 35 U.S.C. 154(b) by 165 days.

(21) Appl. No.: 11/384,736

(22) Filed: Mar. 20, 2006

Related U.S. Application Data

(60) Provisional application No. 60/663,656, filed on Mar. 21, 2005.

(51) Int. Cl.
*G11C 15/00* (2006.01)

(52) U.S. Cl. .................. 365/49.1; 365/154; 365/189.07; 365/230.03

(58) Field of Classification Search .................... 365/49, 365/154, 189.07, 230.03, 49.1
See application file for complete search history.

(56) References Cited

U.S. PATENT DOCUMENTS

| | | | |
|---|---|---|---|
| 4,523,301 A | 6/1985 | Kadota et al. | |
| 4,646,271 A | 2/1987 | Uchiyama et al. | |
| 4,845,668 A | 7/1989 | Sano et al. | |
| 5,339,268 A | 8/1994 | Machida | |
| 6,108,227 A | 8/2000 | Voelkel | |
| 6,266,262 B1 | 7/2001 | Washburn et al. | |
| 6,505,270 B1 | 1/2003 | Voelkel et al. | |
| 6,564,289 B2 | 5/2003 | Srinivasan et al. | |
| 7,173,837 B1 * | 2/2007 | Bettman et al. | 365/49.17 |

* cited by examiner

*Primary Examiner*—Hoai V Ho
(74) *Attorney, Agent, or Firm*—Haverstock & Owens, LLP

(57) ABSTRACT

A content addressable memory (CAM) device can include a plurality of CAM cells arranged in rows and columns to form multi-byte words. Each CAM cell can include a comparator circuit and one or more data storing circuits. Each comparator circuit can have one or more charge transfer paths arranged between a match line and a first voltage source node. Each data storing circuit can include a write circuit that provides a controllable impedance path between one or more charge transfer paths and a data storage node of the data storing circuit.

7 Claims, 10 Drawing Sheets

CONTENT ADDRESSABLE MEMORY (CAM) CELL HAVING COLUMN-WISE CONDITIONAL DATA PRE-WRITE

This application claims the benefit of U.S. Provisional Patent Application Ser. No. 60/663,656, filed Mar. 21, 2005, the contents of which are incorporated by reference herein.

TECHNICAL FIELD

The present invention relates generally to memory devices, and more particularly to a content addressable memory (CAM) cell and/or device.

BACKGROUND OF THE INVENTION

Memory devices, such as random access memories (RAMs) and read only memories (ROMs) can access single entries according to applied addresses. However, other types of memory devices can provide a matching function with respect to all entries in the device. One such type of memory device is a content addressable memory (CAM) device.

CAM devices can provide a rapid comparison between a specific pattern of received data bits, commonly known as a search key or comparand, and data values stored in an associative CAM memory array to provide a match or no-match result. If every bit in a group of CAM memory cells matches corresponding bits in the comparand, a match flag can indicate a match condition via a match line, for example. In this way, a user can be notified that the data in the comparand was found in memory and a value corresponding to the match can be returned. Thus, in a CAM device, as result can be determined from finding a matching value (content), not from providing the address of the value as done for a RAM or ROM.

Generally, there are two types of CAM cells typically used in conventional CAM arrays: binary CAM cells and ternary CAM (TCAM) cells.

Binary CAM cells can store either a logic high bit value or a logic low bit value. When the logic value stored in the binary CAM cell matches a data bit from an applied comparand, the CAM cell can provide a high impedance path with respect to a match line, and the match line can be maintained at a logic high value (assuming all other CAM cells electrically connected to the match line also match the comparand). In this way, a match (HIT) result can be indicated. However, when the logic value stored in the binary CAM cell does not match the data bit from the applied comparand, the CAM cell can provide a low impedance path between ground and the match line, and the match line can be pulled low. In this way, a no match (MISS) result can be indicated.

Conventional TCAM cells can store three bit values that can represent three different states: a logic high value, a logic low value, and a "don't care" value. When storing logic high and logic low values, a conventional TCAM cell can operate like a binary CAM cell as described above. However, a TCAM cell storing a "don't care" value can provide a match condition for any data bit value from a comparand applied to that TCAM cell.

An exemplary embodiment of an existing TCAM cell is set forth in FIG. 9 in a circuit schematic diagram and given the general reference character 900.

Conventional TCAM cell 900 includes an X-cell 910, a Y-cell 920, and a compare circuit 930. Conventional TCAM cell 900 can have complementary bit lines (B1 and BB1) as inputs to Y-cell 920, and complementary bit lines (B2 and BB2) as inputs to X-cell 910. X-cell 910 and Y-cell 920 can receive a word line WL as a common input. Compare circuit 930 receives complementary compare data values (CD and BCD) as inputs, as well as X-cell stored data and Y-cell stored data at inputs YD and XD, respectively. Compare circuit 930 can provide a match output at match line ML.

X-cell 910 and Y-cell 920 can be essentially static random access memory (SRAM) cells having two inverters and two pass transistors. Compare circuit 930 can have two serially connected transistors providing the X-cell compare and two serially connected transistors providing the Y-cell compare.

Conventional TCAM cell 900 can have six lines that run vertically. These six lines can be the complementary bit lines (B1, BB1, BB2, and B2) and lines that carry complementary compare data (CD and BCD). Such use of six lines can be necessary to provide writing flexibility. More particularly, such a six line arrangement can be provided to support "non-atomic" writes, bit-wise maskable writes, or bit maskable parallel writes. Non-atomic writes can refer to writing different values to the separate SRAM cells (e.g., X-cell 910 or Y-cell 920) of TCAM cell 900. Bit maskable can refer to the ability to write to a first bit (BIT1) to a TCAM cell (X-cell X1, Y-cell Y1) in a word including or made up of a number of cells in a row, without writing a second bit (BIT2) to a TCAM cell (X-cell X2, Y-cell Y2) in the same row. Parallel writes can refer to writing a value to the same bit locations of multiple rows.

DETAILED DESCRIPTION OF THE EMBODIMENTS

The various embodiments are directed to content addressable memories (CAMS) and more specifically to a single ended ternary CAM (TCAM) cell that can enable non-atomic, bit-maskable, and/or parallel writes.

In the following description, for purposes of explanation, numerous specific details are set forth in order to provide a thorough understanding of the present invention. It will be evident, however, to one skilled in the art that the present invention may be practices without these specific details. In other instances, well-known circuits, structures, and techniques may not be shown in detail or may be shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearance of the phrase "in one embodiment" in various places in the specification does not necessarily all refer to the same embodiment. The term "to couple" or "electrically connect" as used herein may include both to directly and to indirectly connecting through one or more intervening components.

The architecture and operation of a single ended CAM cell that may enable atomic, bit-maskable, parallel writes using column-wise conditional pre-writes according to various embodiments of the present invention will now be described in greater detail with reference to a number of drawings.

Figure 1:
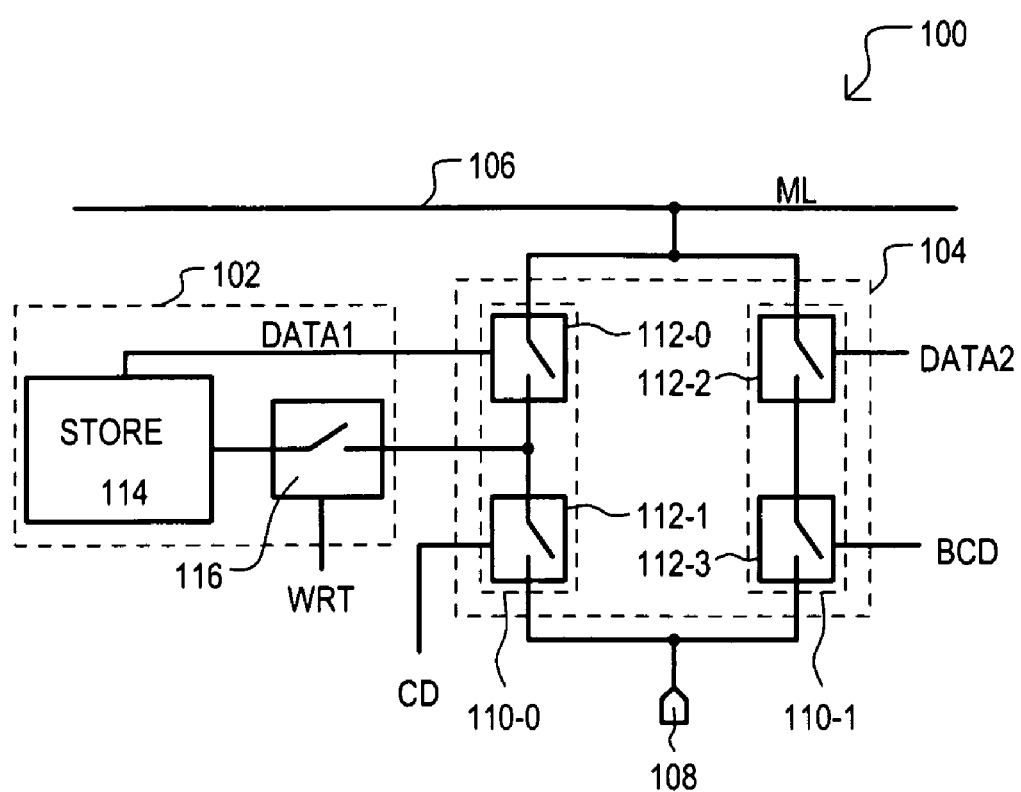
FIG. 1 is a block schematic diagram of a content addressable memory (CAM) cell according to a first embodiment.

A CAM cell according to a first embodiment is set forth in FIG. 1, and designated by the general reference character 100. A CAM cell 100 can include a storage cell 102 and a stack (or compare) section 104. A stack section 104 can provide charge transfer paths between a match line 106 and a reference node 108. Prior to the application of compare data, a potential difference can be established between match line 106 and reference node 108. In response to the application of compare data, compare section 104 can provide either a high or low impedance path. A match result (e.g., either HIT or MISS) can be generated in response to charge transferring between match node 106 and reference node 108.

In the particular example of FIG. 1, stack section 104 can include a first charge transfer path 110-0 and a second charge transfer path 110-1. A first charge transfer path 110-0 can include a first switch device 112-0 and a second switch device 112-1 in series with one another. A first switch device 112-0 can be controlled according to a data value provided by storage cell 102, while a second switch device 112-1 can be controlled according to a first compare data signal (CD). A second charge transfer path 110-1 can include a third switch device 112-2 and a fourth switch device 112-3 in series with one another. A third switch device 112-2 can be controlled according to a data value, and a fourth switch device 112-3 can be controlled according to a second compare data signal (BCD).

A storage cell 102 can include a store circuit 114 that can provide a data value DATA1 to stack section 104. Unlike conventional approaches, storage cell 104 can also include a write circuit 116 that can write data to store circuit 114 from charge transfer path 110-0. In the particular example of FIG. 1, a write circuit 116 can include a switch device 116 controlled according to a write signal WRT.

Referring still to FIG. 1, in one particular write operation to storage cell 102, a write signal WRT can be driven to enable switch device 116 (place device in low impedance state). Reference node 108 can then be driven to a desired write potential (e.g., low). A compare data signal CD can then be driven to enable switch device 112-1, and thus enable a current path between store circuit 114 and reference node 108.

In this way, a CAM cell can include a write circuit that writes a data value from a compare circuit (e.g., stack section), rather than a bit line, or the like.

Figure 2:
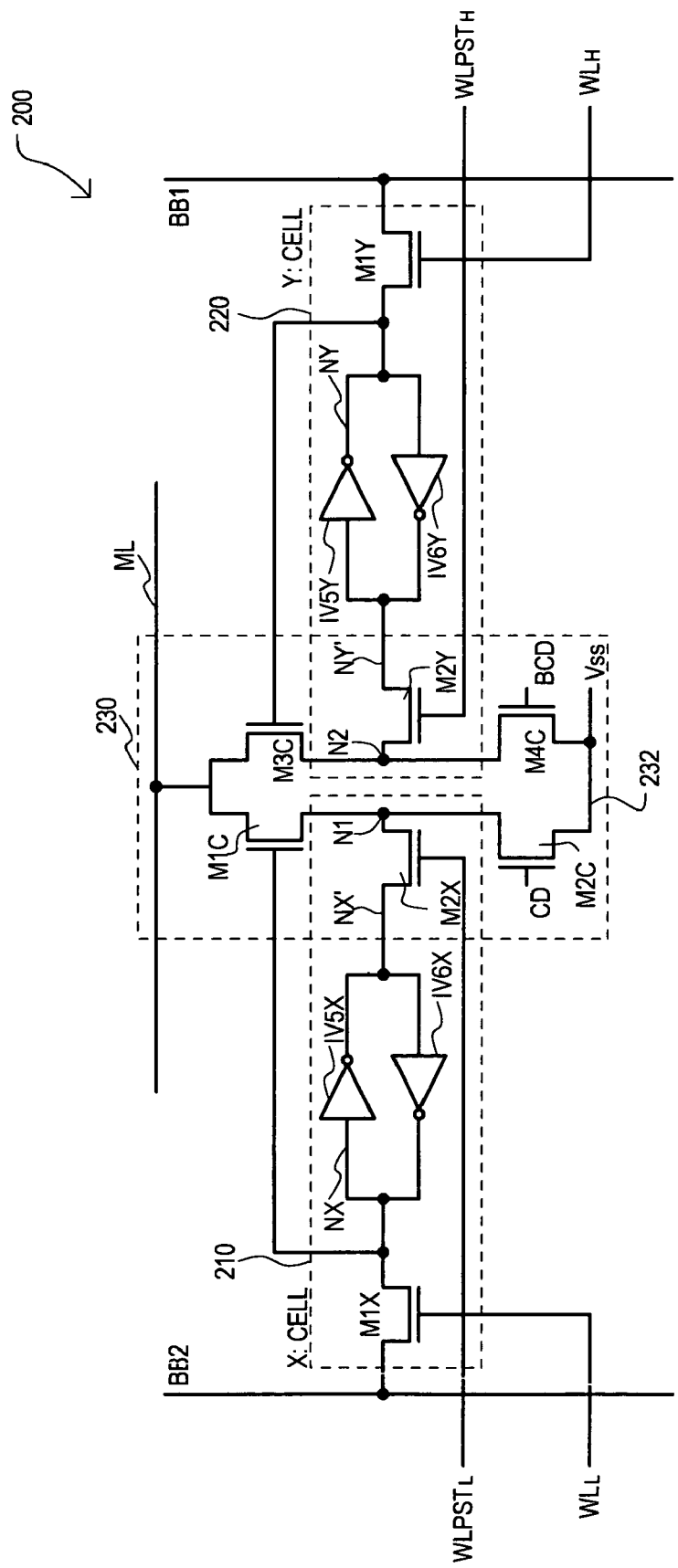
FIG. 2 is a circuit schematic diagram of a ternary CAM (TCAM) cell according to a second embodiment.

Referring now to FIG. 2, a circuit schematic diagram of a ternary CAM (TCAM) cell according to a second embodiment is shown and designated by the general reference character 200. TCAM cell 200 can operate to provide any of the following write features: single ended writes, symmetrical writes, bit-maskable writes, non-atomic writes, bit-maskable parallel writes. Such write operations can utilize a column-wise conditional pre-write to execute such functions, as will be described in more detail below.

A TCAM cell 200 can include an X-cell 210, a Y-cell 220 and a comparator (or stack) 230. An X-cell 210 can be connected to a first bit line BB2, a first lower word line $WL_L$, and receive a first lower pre-write signal $WLPST_L$. X-cell 210 can store complementary data values on storage nodes NX and NX', and be connected to comparator 230 at a first internal node N1. In the particular example of FIG. 2, X-cell 210 can include cross-coupled inverters (IV5X and IV6X) and n-type insulated gate field effect transistors (IGFETs) M1X and M2X. IGFET M1X can have a source/drain path connected between bit line BB2 and a storage node NX, and a gate connected to lower word line $WL_L$. IGFET M2X can have a source/drain path connected between node N1 of comparator 230 and a second node NX' of X-cell, and a gate connected to receive lower pre-write signal $WLPST_L$. IGFET M2X can be conceptualized as forming a write circuit for X-cell 210.

Y-cell 220 can be essentially symmetrical to X-cell 210, being connected to a second bit line BB1, a second lower word line $WL_H$, and receiving a second lower pre-write signal $WLPST_H$. Y-cell 220 can store complementary data values on nodes NY and NY', and be connected to comparator 230 at a second internal node N2. Within Y-cell 220, IGFET M2Y can be conceptualized as forming a write circuit for Y-cell 220.

Referring still to FIG. 2, a comparator 230 may be connected between a match line ML and a voltage node 232. Comparator 230 can receive complementary compare data signals (CD and BCD), as well as stored data values from storage nodes (NX and NY) from X-cell 210 and Y-cell 220, respectively. Within comparator 230, internal nodes (N1 and N2) can serve as write data outputs. According to compare data signals (CD and BCD) and data stored within X and Y cells (210 and 220), comparator 230 can either maintain a high impedance, or enable a charge transfer path between a match line ML and voltage node 232.

In the very particular example of FIG. 2, comparator 230 can includes IGFETs M1C to M4C. IGFETs M1C to M4C can be NFETs, as just one example. IGFETs M1C and M2C can form a first charge transfer path, with IGFET M1C having a source/drain path connected between match line ML and internal node N1, and a gate connected to the storage node NX of X-cell 210. IGFET M2C can have a source/drain path connected between internal node N1 and voltage node 232, and a gate connected to receive a compare data signal CD. In a similar fashion, IGFETs M3C and M4C can form a second charge transfer path. IGFET M3C can have a source/drain path coupled between match line ML and internal node N2, and a gate connected to node NY of Y-cell 220. IGFET M4C can have a source/drain path connected between internal node N2 and voltage node 232, and a gate coupled to receive a complementary compare data signal BCD.

A comparator 230 can be conceptualized as a stack that compares stored data values at nodes NX and NY to a compared data value, as indicated by compare data signals CD and BCD. In addition, a comparator 230 can serve as a source of "pre-write" data that can force either X-cell 210, Y-cell 320, or both such cells to store a predetermined data value. In particular, internal nodes of a latch circuit (e.g., IV5X/IV6X or IV5Y or IV6Y) can be electrically isolated from voltage node 232 by at least one IGFET (i.e., M2C or M4C) in the stack 230. Further, such IGFETs can be controlled in a column-wise manner. Thus, each storage cell in a row of TCAM cells of an array can be written to independently of other such storage cells in the same row. Thus, writes can be bit-maskable and non-atomic.

Figure 9:
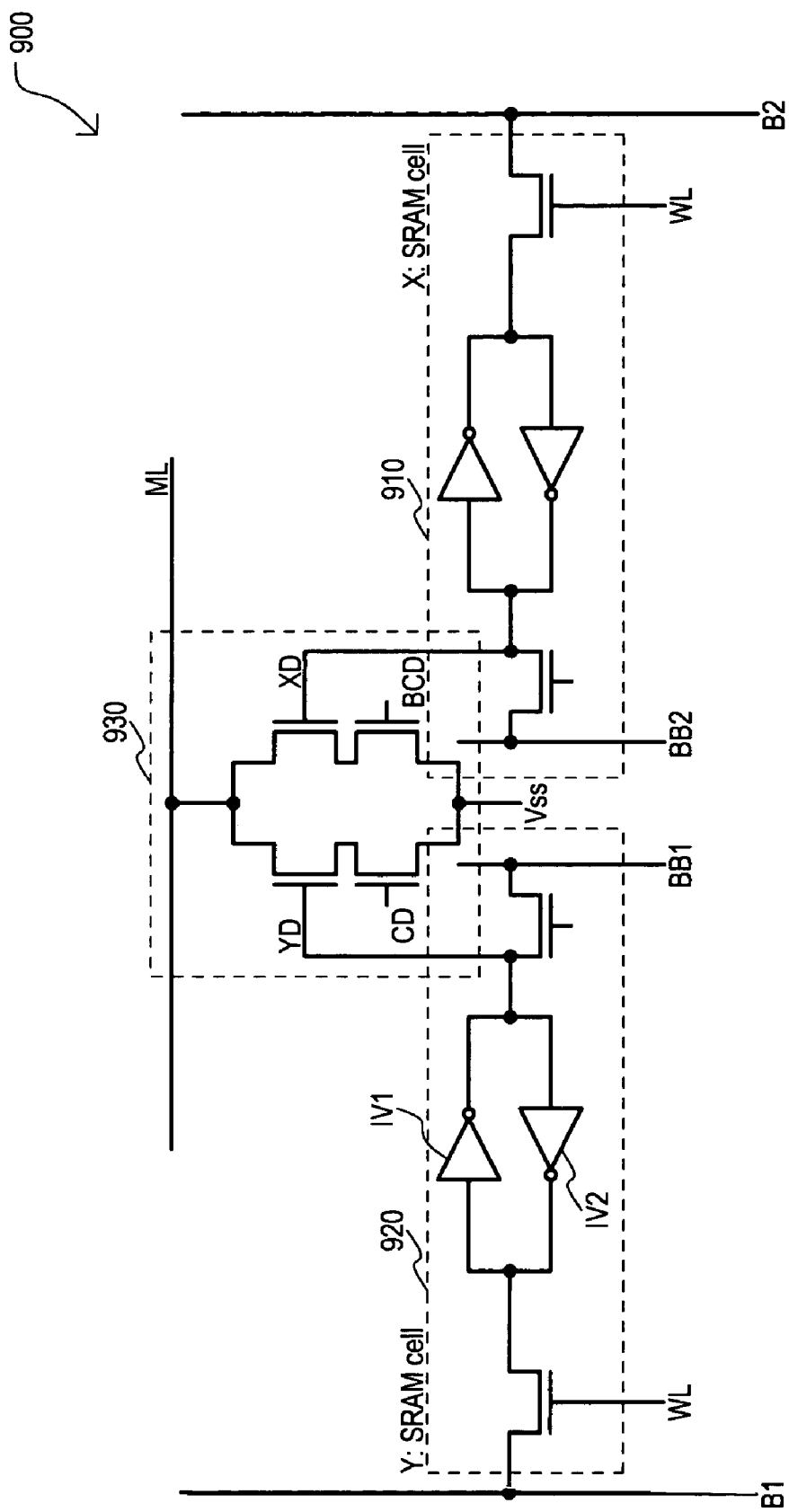
FIG. 9 is a circuit schematic diagram of a conventional TCAM cell.

It is noted that the TCAM cell 200 may include four vertical lines (bitline BB1, bitline BB2, compare data signal line for CD, and complementary compare data signal line for BCD)

as opposed to the conventional approach of FIG. 9, which can include six vertical lines. In this way, layout may be simplified and/or die size may be reduced.

The operation of a TCAM cell 200 according to the embodiment of FIG. 2 will now be described.

Referring still to FIG. 2, according to one embodiment, data can be written to a TCAM cell 200 utilizing a single ended column-wise conditional pre-write. In such an operation, a value of "1" can be written to both X-cell 210 and Y-cell 220 and may be accomplished by writing a "1" to storage nodes (NX and NY). This may be accomplished by driving lower and upper pre-write signals (WLPST$_L$ and WLPST$_H$), compare data signal CD, and complementary compare data signal BCD all to a logic high level while maintaining match line ML to a logic low level. In such an arrangement, IGFETs (M2C and M4C) can be turned on and internal nodes (N1 and N2) can be pulled to the potential of voltage node 232, which in this example can be a ground potential VSS. With lower and upper pre-write signals (WLPST$_L$ and WLPST$_H$) at a logic high level, IGFETs (M2X and M2Y), operating as pre-write circuits, can be enabled (provide a low impedance) resulting in the input of inverters (IV6X and IV5Y) being pulled to or toward the VSS level. With the input of inverters (IV6X and IV5Y) at a logic low level, data storing nodes (NX and NY) may be forced to a logic high level. In this way, a "1" may be written to data storing nodes (NX and NY).

It is noted that in the above described pre-write operation, match line ML is held low to prevent current from flowing through IGFETs (M1C or M3C) if either data storing node (NX or NY) already stores a "1" before such a pre-write operation.

While above describes a non-atomic pre-write to both X-cell 210 and Y-cell 220, a logic "1" can be written to only one such cell in an atomic pre-write operation. For example, a column-wise conditional pre-write may be performed to only X-cell 210 by writing a "1" to storage node NX (and not writing any particular data value to storage node NY). This can be accomplished by taking lower pre-write signal WLPST$_L$ and compare data signal CD to a logic high level, while maintaining match line ML at a low level, and complementary compare data signal BCD to a logic low level. With compare data CD at a logic high level, IGFET M2C may be turned on and internal node N1 may be pulled to a ground potential VSS. With lower pre-write signal WLPST$_L$ at a logic high level, IGFET M2X can be turned on and the input of inverter IV6X can be pulled to a low. Inverter IV6X can thus force data storing node NX a logic high level. In this way, a "1" may be written to data storing node NX. At the same time, because signals BCD and WLPST$_H$ remain low, IGFET M4C can isolate Y-cell 320 from voltage node 232, preventing any write operation to Y-cell 220.

A column-wise conditional pre-write may be performed to only Y-cell 220 in the same general fashion, by driving upper pre-write signal WLPST$_H$ and complementary compare data BCD to a logic high level while holding the match line ML and compare data CD to a logic low level.

In operation, TCAM cell 200 may represent a one value ("1"), a zero value ("0") or a "don't care" value ("1/0"). In the ("1") state, X-cell 210 can store a logic high at storage node NX and Y-cell 220 can store a logic low value at storage node NY. In the ("0") state, X-cell 210 can store a logic low at storage node NX and Y-cell 220 can store a logic high value at storage node NY. In the "don't care" state, X-cell 210 can store a logic low at data storing node NX and Y-cell 220 can store a logic low value at storage node NY.

To arrive at such stored data values, following a pre-write operation as described above, a write operation can be performed to store the desired state. Looked at in another way, a pre-write operation can write one logic state (in this example, "1"), so a follow-on write operation can be used to store the other logic state (in this example a "0").

First, an operation that writes a "0" to X-cell 210 and a "1" to Y-cell 220 will be described. Initially, one (1) values can be written to both X-cell 210 and Y-cell 220 simultaneously according to a pre-write operation as set forth above. After such pre-write operation, bitline BB2 can be driven low, while bitline BB1 is maintained at a high level. In addition, pre-write signals (WLPST$_L$ and WLPST$_H$) may also be maintained low. Lower word line WL$_L$ may then be driven to a high level. In such an arrangement, IGFET MIX can be enabled and storage node NX can be pulled low by bitline BB2, and latch IV5X/IV6X can latch "0" logic value.

Next, an operation that writes a "1" to X-cell 210 and a "0" to Y-cell 220 will be described. Initially, one (1) values can be written to both X-cell 210 and Y-cell 220 with a pre-write operation as set forth above. After the pre-write operation, bitline BB1 may be pulled low, while bitline BB2 may be at a high level. Pre-write signals (WLPST$_L$ and WLPST$_H$) may be held low. Upper wordline WL$_H$ may then be driven a high level, turning on IGFET M1Y forcing data storing node NY to be pulled low by bitline BB1.

The above can be considered non-atomic write operations, as data is driven on both bit lines BB2/BB1 in order to establish logic values in both X and Y cells (210 and 220). However, a write to only one such cell is possible in the embodiment of FIG. 2.

To write to only X-cell 210 may be performed by executing a pre-write operation only to X-cell 210 as set forth above. After the pre-write operation, bitline BB2 can be driven to a desired write value (i.e., low), while bitline BB1 may be at a high level. Pre-write signals (WLPST$_L$ and WLPST$_H$) can be held low. Lower wordline WL$_L$ can then be pulled to a high level. With lower wordline WL$_L$ at a high level, IGFET MIX may be turned on and storage node NX may be pulled low by bitline BB2 if the "value" is a "0" (i.e. logic low) or remain at a "1" level if the "value" is a "1" (i.e. logic high).

A write to only Y-cell 220 can be accomplished by performing a pre-write operation only to Y-cell 220 as set forth above. After the pre-write operation, bitline BB1 can be driven to a desired write value (i.e., low), while bitline BB2 may be at a high level. Pre-write signals (WLPST$_L$ and WLPST$_H$) may be held low. Upper wordline WL$_H$ may then be driven high, turning on IGFET M1Y. As a result, storage node NY may be pulled low by bitline BB1 if the "value" is a "0" (i.e. logic low) or remain at a "1" level if the "value" is a "1" (i.e. logic high).

Referring still to FIG. 2, read operations of a TCAM cell 200 can be "single ended" from either X-cell 210 or Y-cell 220, or both. In a read operation, a respective bitline (BB1, BB2 or both) can be precharged to a high level. A desired word line (WL$_L$, WL$_H$ or both) can be driven high, while pre-write signals (WLPST$_H$ and WLPST$_L$) can both be maintained low. In this way, stored data values for X-cell 210, Y-cell 220, or both may be read onto bitlines BB1 and/or BB2.

A compare operation for the embodiment of FIG. 2 will now be described. In a compare operation, compare data and complementary compare data signals (CD and BCD) may be initially precharged to a low level (Vss), while match line ML may be initially precharged to a high level, such as a power supply voltage (Vcc), as but one example. Because, signals CD and BCD are both at a low level, IGFETs M2C and M4C can be turned off (e.g., present a high impedance), thus preventing charge from flowing through IGFET paths M1C/M2C or M3C/M4C) from the match line ML to ground Vss.

When the compare operation occurs, either compare data signal CD or complementary compare data signal BCD can transition to a high level. In this way, one of IGFETs M2C or M4C can be enabled. A mis-match (MISS) may occur when a charge transfer path (M1C/M2C or M3C/M4C) is enabled by a received stored data value from data storing node (NX or NY) at the respective IGFET (M1C or M3C). In such a case, match line ML can be pulled to the potential of voltage node 232 (e.g., low). Conversely, a match (HIT) can occur when both charge transfer paths (M1C/M2C and M3C/M4C) are disabled (present high impedance). As a result, a match line ML can remain at the precharge level (e.g., high), again assuming the match line is not discharged by a MISS in another cell of the same row.

It is noted that when TCAM 200 stores a "don't care" value, both data storing nodes (NX or NY) can store a logic zero. Accordingly, regardless of the level of compare data signals (CD and BCD) charge transfer paths (M1C/M2C and M3C/M4C) will be disabled, thus forcing a match result.

It is also noted that a pre-write operation can place both data storing nodes (NX and NY) to a logic high level. In this case, both upper IGFETs (M1C and M2C) are turned on and a mis-match can always occur in a compare operation.

While FIG. 2 shows one very particular example of an X/Y TCAM cell, the general approach shown can be applied to other compare circuits and CAM cell types. One such example is illustrated in FIG. 3.

Figure 3:
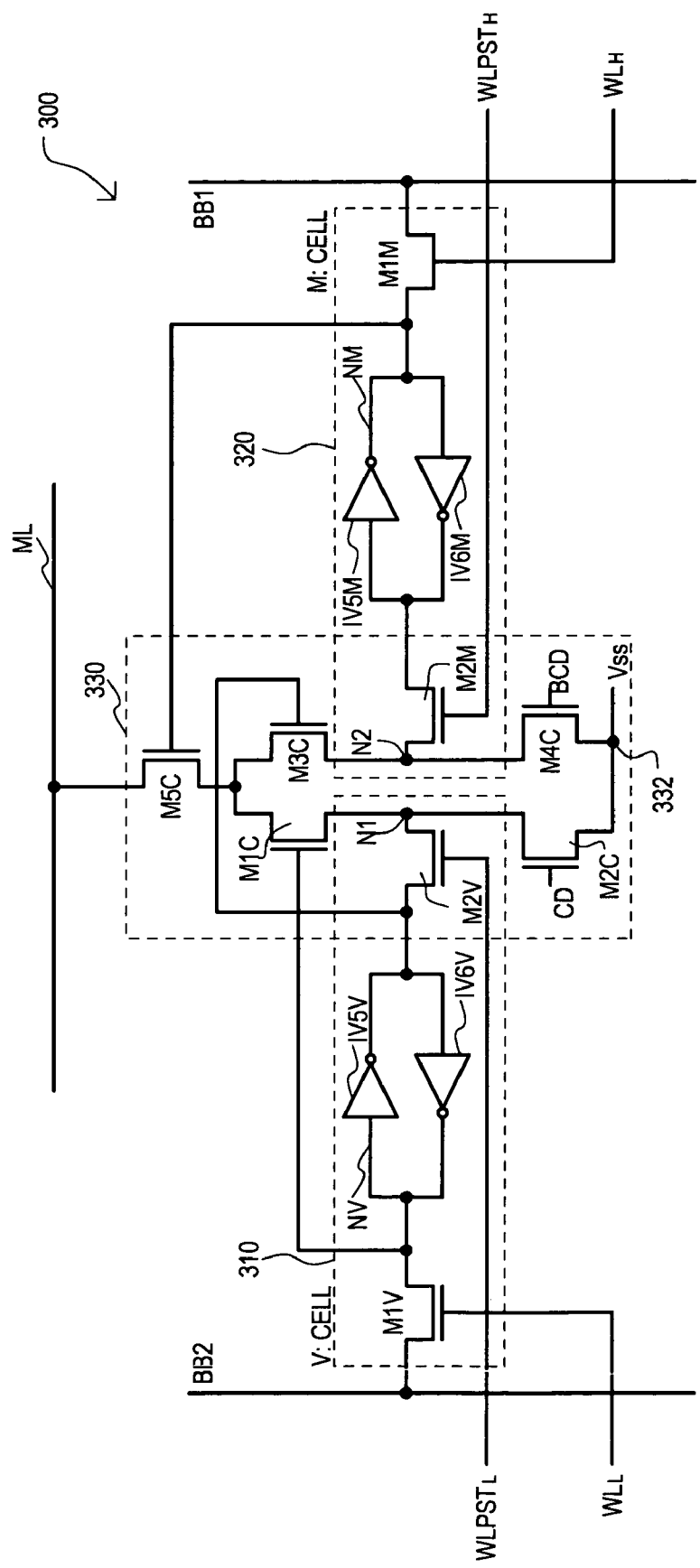
FIG. 3 is a circuit schematic diagram of a TCAM cell according to a third embodiment.

FIG. 3 is a circuit schematic diagram of a "V/M" type TCAM cell 300. A V/M type TCAM cell 300 can provide a "don't care" value based on a single stored mask value (M), rather than two bit values as in the X/Y case (e.g., X=Y=0).

The particular embodiment of FIG. 3 can include some of the same general structures as FIG. 2. Such like structures will be referred to by the same reference character being a "3" instead of "2".

A TCAM cell 300 can differ from that of FIG. 2 in that it can include a V-cell 310 and M-cell 320, instead of an X-cell and Y-cell. In addition, a comparator (or stack) 330 can include an additional NFET M5C having a source/drain path connected between the drains of transistor M1C/M3C and match line ML. Thus, if M-cell 320 stores a value that results in node NM being low, comparator 330 will not generate a mismatch result. Conversely, if M-cell 320 stores a value that results in node NM being high, comparator 330 will generate a match or mismatch result based on a comparison between data value V stored in V-cell 310 and an applied compare data value represented by compare data signals CD/CDB.

At the same time, data can be written to V-cell 310, M-cell 320 or both, according to the conventions noted above. Thus, such a V/M type CAM cell 300 can also allow for atomic, bit maskable, and column wise writing of data in a V/M type device.

The general approach represented by FIGS. 1-3 need not be limited to ternary CAM cells, and can be applied to binary CAM cells. One such example is illustrated in FIG. 4.

Figure 4:
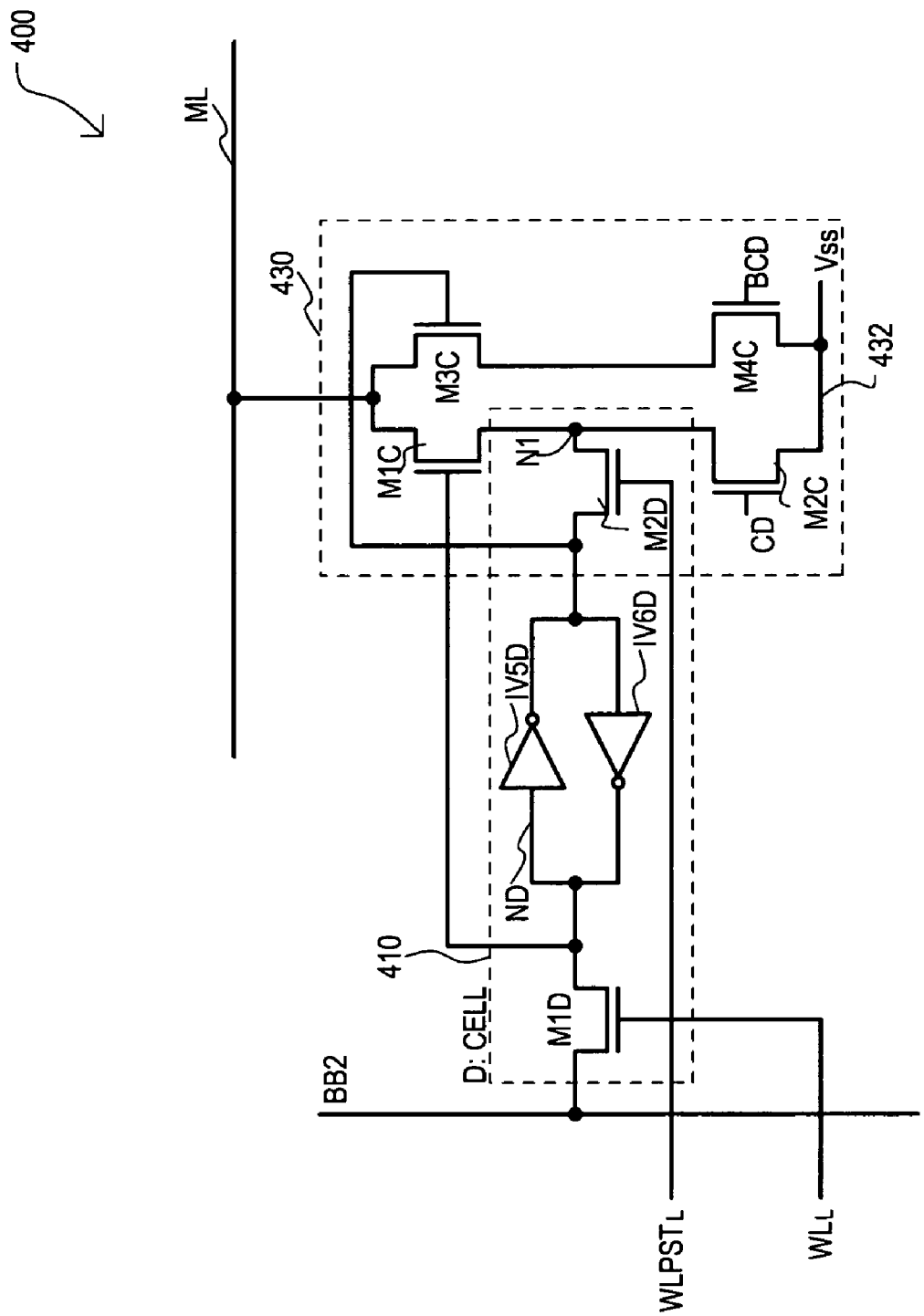
FIG. 4 is a circuit schematic diagram of a binary CAM cell according to a fourth embodiment.

FIG. 4 is a circuit schematic diagram of a binary CAM cell 400. As noted above, a binary CAM cell 400 can provide a matching between a stored data value (D) and an applied compare data value (CD). The particular embodiment of FIG. 4 can include some of the same general structures as FIG. 2. Such like structures will be referred to by the same reference character being a "4 instead of "2".

A TCAM cell 400 can differ from that of FIG. 2 in that it can include one D-cell 410, rather than two such cells. In addition, within a comparator (or stack) 430, IGFET M1C can receive a complementary data value DB, while IGFET M3C can receive a data value D from storage nodes of D-cell 410.

Data can be written to D-cell 410 according to the conventions noted above. This can also allow for column wise writing of data values in a binary CAM device.

Figure 5:
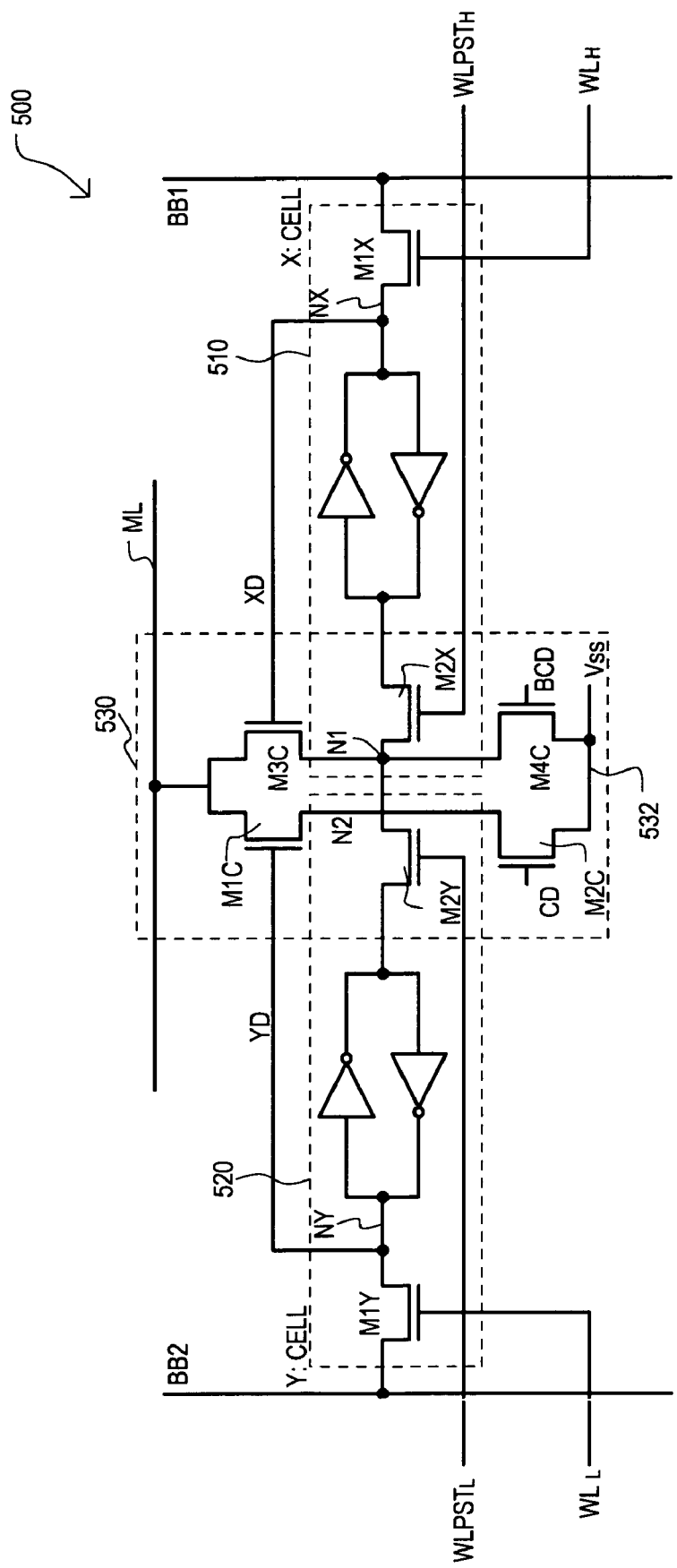
FIG. 5 is a circuit schematic diagram of a TCAM cell according to a fifth embodiment.

Referring now to FIG. 5, a TCAM cell according to a fifth embodiment is set forth in a circuit schematic diagram and given the general reference character 500. TCAM cell 500 may include similar constituents as TCAM cell 200. Such like constituents are referred to by the same reference character but with the first digit being a "5" instead of "2".

TCAM cell 500 can differ from TCAM cell 200 of FIG. 2 in that an X-cell 510 can receive the upper pre-write signal $WLPST_H$ and upper wordline $WL_H$ and has a data storing node NX connected to control a charge transfer path formed by IGFETs M3C/M4C. In addition, Y-cell 520 can receive the lower pre-write signal $WLPST_L$ and lower wordline $WL_L$ and has a data storing node NY connected to enable a charge transfer path formed by IGFETs M1C/M2C.

Yet another difference between TCAM cell 500 and TCAM cell 200 is that Y-cell 520 can have a write circuit (IGFET M2Y) having a source/drain connected to internal node N1 instead of internal node N2. In such an arrangement, a pre-write operation may be performed by taking only one of the complementary compare data lines (BCD and CD) high instead of both. In this case, only complementary compare data line BCD need be driven high. Alternatively, pre-write circuits of both X-cell 510 and Y-cell 520 may be commonly connected to internal node N2 and then only compare data line CD may be taken high in a pre-write operation. Otherwise, TCAM cell 500 may operate in the same manner as TCAM cell 300 of FIG. 3.

TCAM cell 500 may support both non-atomic and bit-maskable writes and may operate to perform single ended column-wise conditional pre-writes, writes, and compare operations in substantially the same manner as described with the TCAM cell 200 of FIG. 2 and a further description will not be repeated in detail here.

Figure 6:
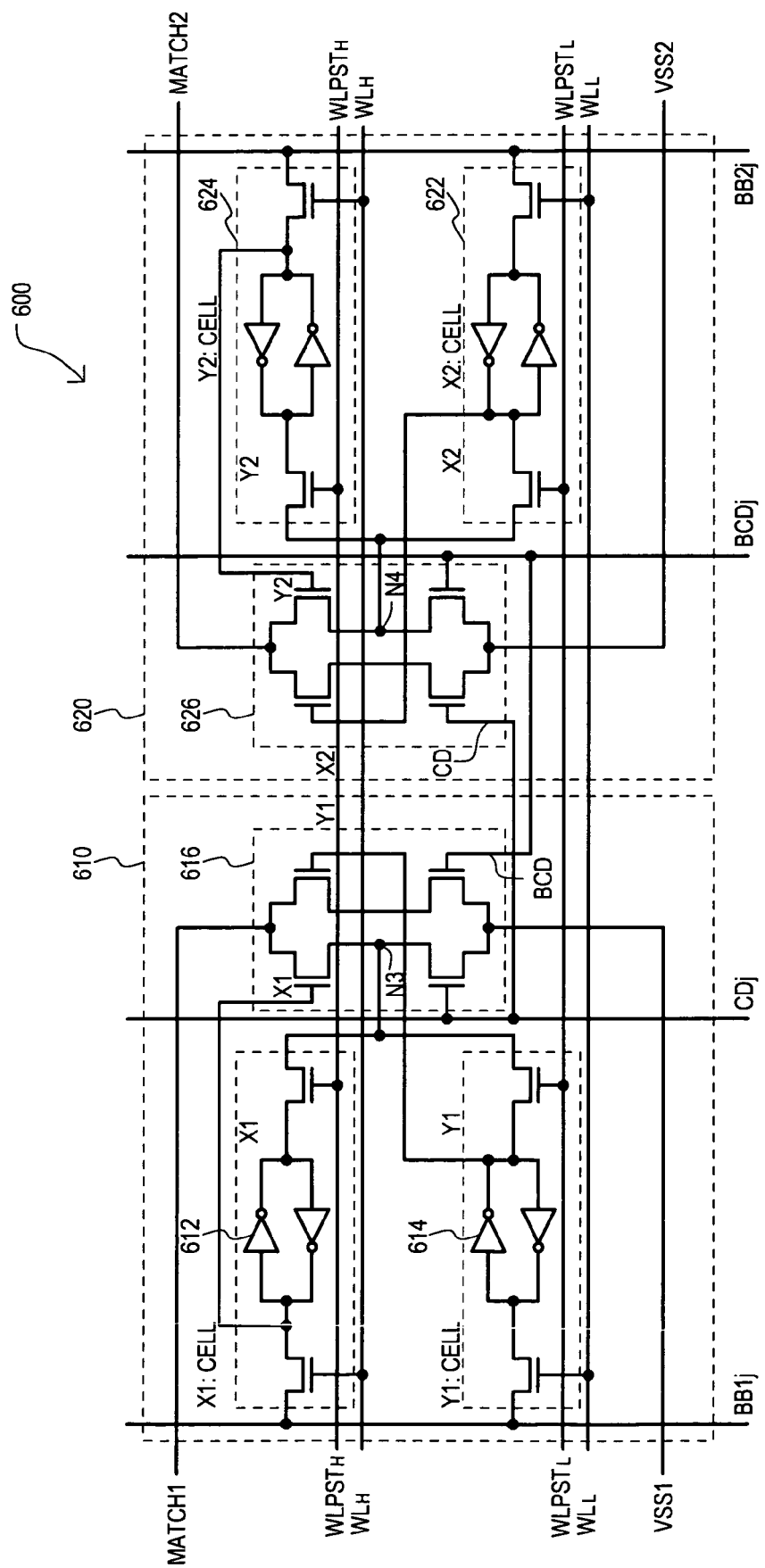
FIG. 6 is a schematic diagram of a floor plan for a layout of adjacent TCAM cells according to an embodiment.

Referring now to FIG. 6, a schematic diagram that illustrates a general floor plan for a layout of adjacent TCAM cells according to an embodiment is set forth and given the general reference character 600. TCAM cell layout 600 can include a first TCAM cell 610 and a second TCAM cell 620. TCAM cells 610 and 620 can be similar to TCAM cells (200 and 500) of FIGS. 2 and 5 and thus a general description of such is omitted.

TCAM cell 610 can include an X-cell 612, a Y-cell 614 and a comparator 616. TCAM cell 620 can include an X-cell 622, a Y-cell 624 and a comparator 626. FIG. 6 illustrates an interleaved layout method for adjacent TCAM cells 600. For example, X-cell 612 of TCAM cell 610 may be an upper X-cell and may be connected to upper pre-write signal $WLPST_H$ and upper wordline $WL_H$, while Y-cell 614 of TCAM cell 610 may be a lower Y-cell and may be connected to lower pre-write signal $WLPST_L$ and lower wordline $WL_L$.

On the other hand, Y-cell 624 of TCAM cell 620 may be an upper Y-cell and may be connected to upper pre-write signal $WLPST_H$ and upper wordline $WL_H$ and X-cell 622 of TCAM cell 620 may be a lower X-cell and may be connected to lower pre-write signal $WLPST_L$ and lower wordline $WL_L$. In this way, adjacent TCAM cells may be interleaved.

Yet another interleaving feature of the arrangement of FIG. 6 can be that adjacent TCAM cells 610 and 620 can allow independent pre-write operations. TCAM cell 610 may include pre-write circuits connected to an internal node N3 of comparator 616 in a compare stack connected to receive compare data CDj, while TCAM cell 620 may include pre-write circuits connected to an internal node N4 of comparator 626 in a compare stack connected to receive complementary compare data BCDj. In this way, a pre-write operation may be selectively performed for a single TCAM cell while still sharing compare data signals (CDj and BCDj).

In the arrangement of FIG. 6, single ended, bit-maskable, non-atomic X/Y CAM cells may be independently pre-writable. For example, in a pre-write operation to X-cell 612, match line MATCH1 may be driven to a low level, upper pre-write signal $WLPST_H$ and compare data CDj may each be driven to a high level. Alternatively, in a pre-write operation to X-cell 622, match line MATCH2 may be driven to a low level, lower pre-write signal $WLPST_L$ and complementary compare data BCDj may each be driven to a high level.

Figure 7A:
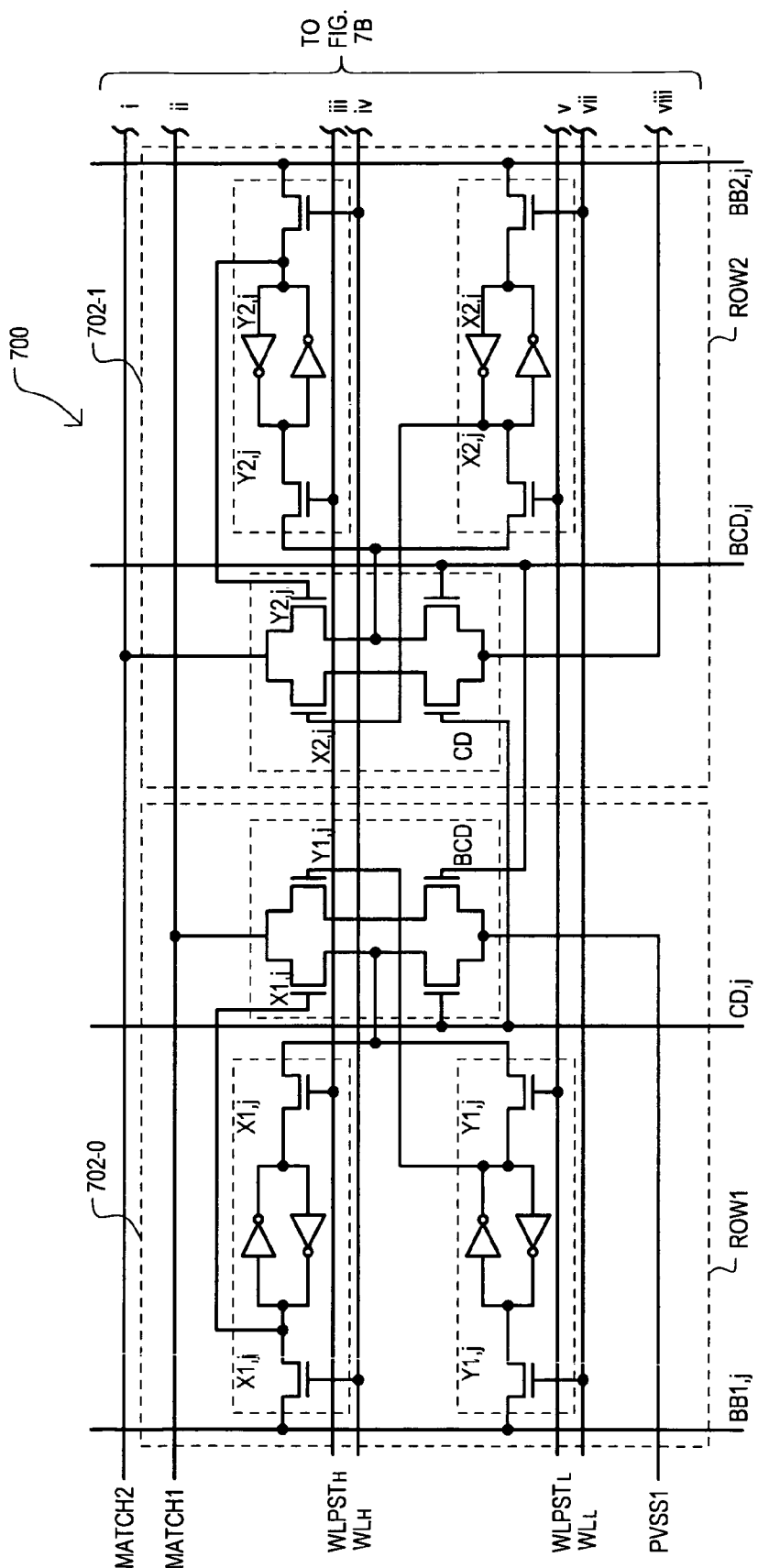
FIGS. 7A and 7B are an exemplary layout of a word organization in a CAM device having a number of single ended, non-symmetric, bit-maskable, non-atomic X/Y CAM cells according to an embodiment.
Figure 7B:
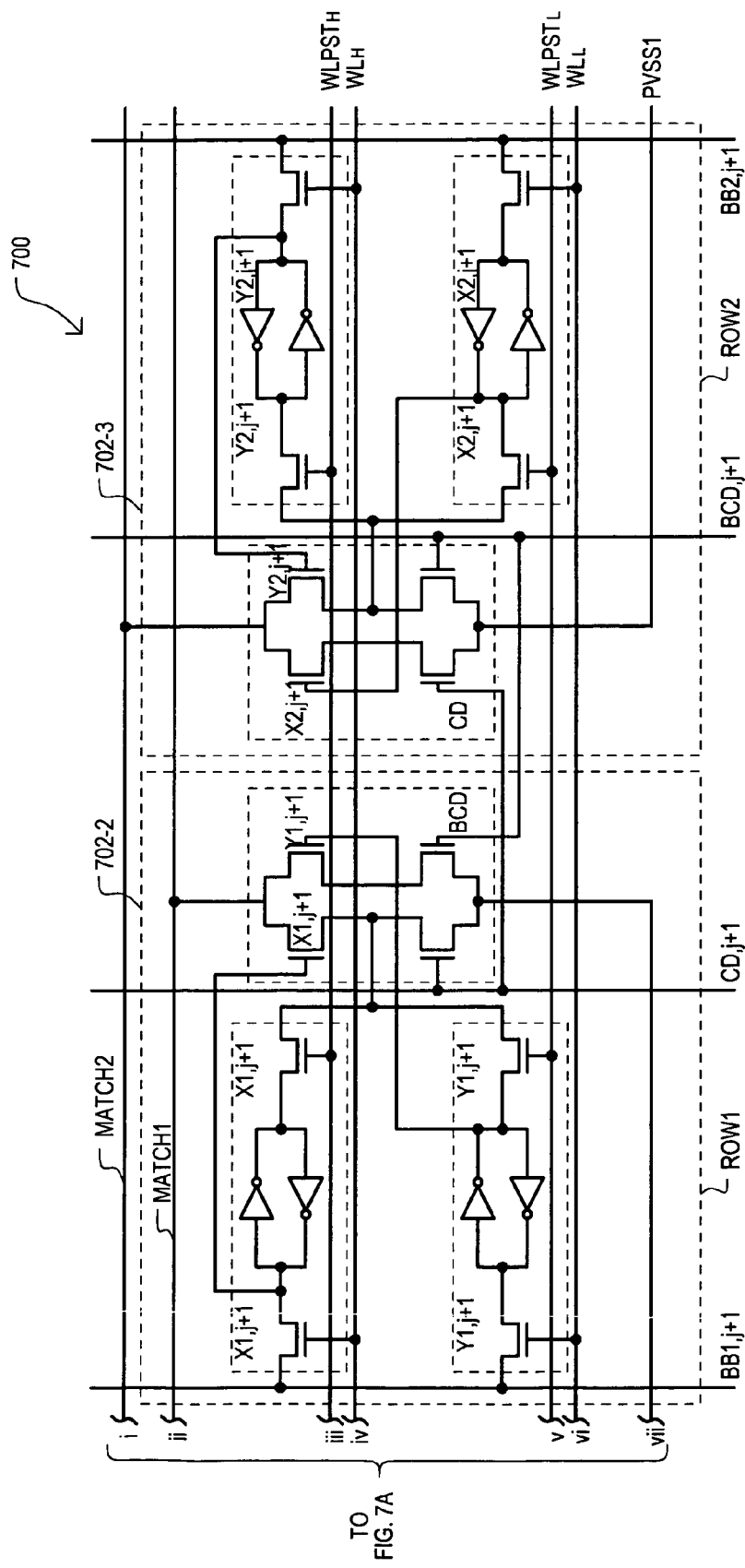

Referring now to FIGS. 7A and 7B, an exemplary word layout of CAM device having a number of single-ended, non-symmetric, bit-maskable, non-atomic X/Y CAM cells according to an embodiment is set forth and given the general reference character 700. FIGS. 7A and 7B are a schematic layout illustrating four CAM cells (TCAM cells) electrically connected together and arranged in a physical row to form logical words. In FIGS. 7A and 7B, it can be seen that odd and even rows (words) of CAM cells in the TCAM device 700 may be interleaved such that alternate CAM cells belong to a same word (row).

In particular, in FIG. 7A shows TCAM cells 702-0 and 702-1, with TCAM cell 702-0 being connected to match line MATCH1, and thus belonging to first row (ROW1). However, adjacent TCAM cell 702-1 can be connected to match line MATCH2, and thus belong to a second row (ROW2). In the same fashion, FIG. 7B shows TCAM cells 702-2 and 702-3, with TCAM cell 702-2 being connected to match line MATCH1 and belonging to ROW1, and adjacent TCAM cell 702-3 connected to match line MATCH2 and thus belong to row ROW2.

Various of the TCAM cells shown above illustrate examples of CAM cells that are accessed via two signals and/or two word lines. However, it may be desirable in some configurations to have fewer horizontal (row direction) conductive lines. One such arrangement is shown in FIG. 8.

Figure 8:
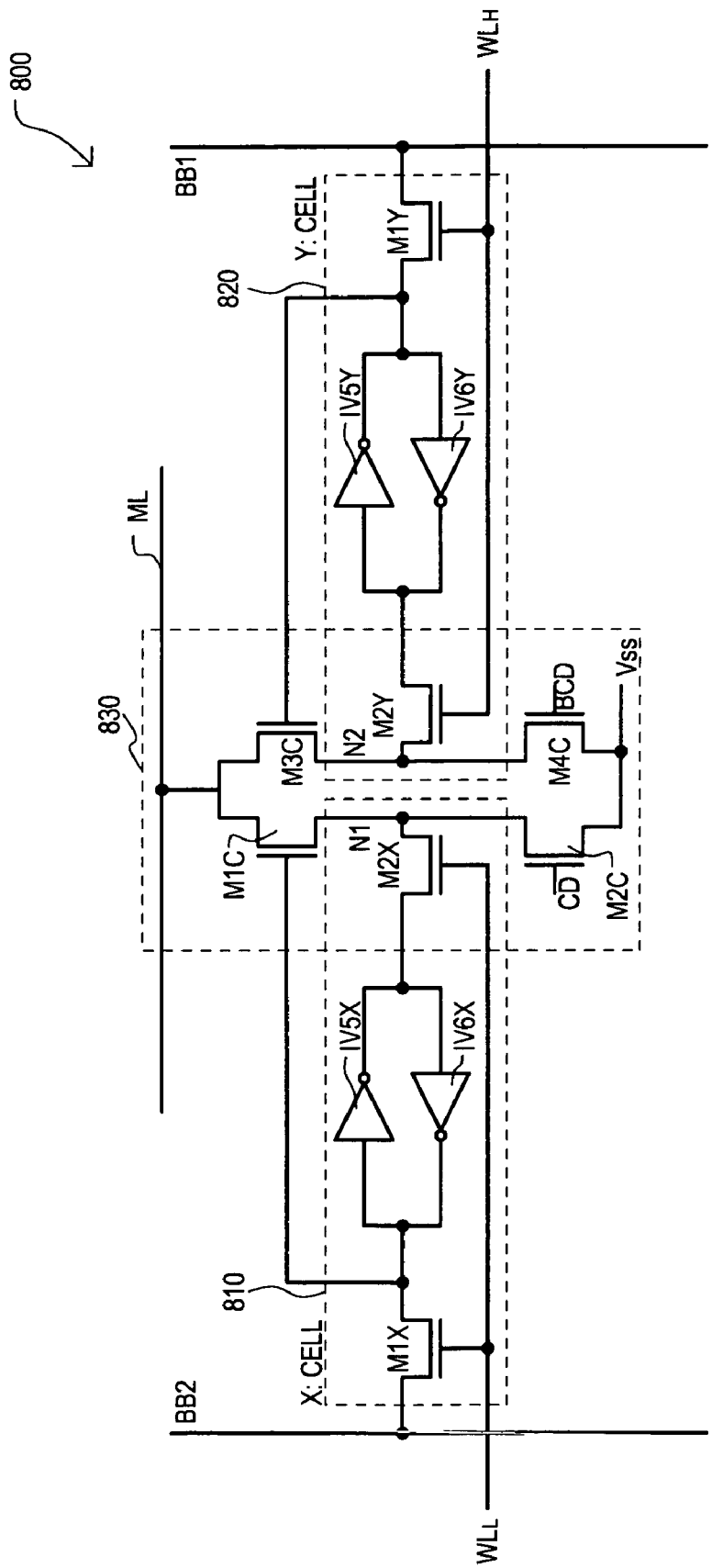
FIG. 8 is a circuit schematic diagram of a TCAM cell according to another embodiment.

Referring now to FIG. 8, a circuit schematic diagram of a TCAM cell according to an eighth embodiment is set forth and given the general reference character 800. TCAM cell 800 can include an X-cell 810, a Y-cell 820, and a comparator 830. TCAM cell 800 may include similar constituents as TCAM cell 200. Such like constituents are referred to by the same reference character but with the first digit being an "8" instead of "2".

TCAM cell 800 can differ from TCAM cell 200 of FIG. 2 in that a wordline ($WL_L$ or $WL_H$) can be used for both the write and pre-write operations. Accordingly, X-cell 810 can include an IGFET M2X (a pre-write circuit) having a control gate connected to receive lower word line $WL_L$, and Y-cell 820 can include an IGFET M2Y (a pre-write circuit) having a control gate connected to receive upper word line $WL_H$.

TCAM cell 800 of FIG. 8 can perform column-wise conditional pre-write operation to X-cell 810 by precharging the bitline BB1 high and driving lower wordline $WL_L$, and compare data signal CD both to a high level. A column-wise conditional pre-write operation to Y-cell 820 may be performed by precharging the bitline BB2 high and driving upper wordline $WL_H$, and complementary compare data signal BCD both to a high level.

It is noted in the above-mentioned embodiments, adjacent TCAM cells may be interleaved so that an even TCAM cell may have an X-cell that receives an upper wordline and upper pre-write signal, while an odd TCAM cell may have an X-cell that receives a lower wordline and lower pre-write signal and vice-versa. Likewise, an odd TCAM cell may have a Y-cell that receives an upper wordline and upper pre-write signal, while an even TCAM cell may have a Y-cell that receives a lower wordline and lower pre-write signal and vice-versa.

Advantages of the present invention may include: (i) the ability to perform bit-maskable, non-atomic writes in one cycle; (ii) the ability to perform bit-maskable, atomic writes in two cycles (same as back-to-back non-atomic writes); (iii) the ability to perform bit-maskable writes to multiple rows of CAM cells within a CAM array; and (iv) the ability to perform single ended writes and reads. In addition, in certain embodiments the layout of X/Y cell may be compatible with that of a mask value (M/V) cell and may use only four vertical signal lines. In this way an area or footprint may not be substantially greater than that of existing TCAM cells. Speed and power characteristics may also be substantially unchanged from existing TCAM cells.

The embodiments have been illustrated using storage cells having the same configuration as six-transistor (6-T) type SRAM cells. However, the invention should not be construed as being limited to such particular circuits. Other types of storage cells can be utilized, including four-transistor (4-T) SRAM cells and/or pseudo-SRAM cells, as but two of the many possible examples.

It is also noted that while the above examples show writes and pre-writes illustrated by pulling down bit-lines and/or internal nodes in a comparator, such this should not be construed as limiting. Such low activation levels arise from incorporating NFETs in such write and/or access circuits. If p-channel IGFETs are used in such write and/or access circuits, writes and pre-writes can include driving bit-lines and/or internal nodes high.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching.

It is also understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A content addressable memory (CAM) device, comprising:
   a plurality of CAM cells arranged in rows and columns to form multi-byte words, each CAM cell comprising
   a stack section having a plurality of transistors forming at least one charge transfer path between a match line and a voltage supply node, and
   at least one memory cell having a first storing node and a second storing node, the first storing node being connected to a bit line by a first access transistor, the second storing node being connected to allow charge to flow between the at least one charge transfer path and the second storing node; wherein the at least one charge transfer path of each CAM cell of the same column is commonly coupled to a data line and enabled in response to the data line carrying a predetermined signal value.

2. The CAM device of claim 1, wherein:

each CAM cell includes a first write circuit that includes the first access transistor and provides a first data value to the first storing node of a first memory cell in response to a first pre-write signal, and a second write circuit that provides the first data value to a third storing node of a second memory cell in response to a second pre-write signal.

3. The CAM device of claim 2, wherein:

the first write circuit is coupled to receive a pre-write voltage from the stack section during a pre-write operation.

4. The CAM device of claim 3, wherein:

the second pre-write circuit is coupled to receive the pre-write voltage from the stack section during a pre-write operation.

5. The CAM device of claim 1, wherein:

the stack section compares data stored at the first storing node of a first memory cell with a first compare data value and compares the data stored at a third data node of a second memory cell with a complementary compare data value, and provides a low impedance path between the match line and the voltage supply node according to a first compare result and a high impedance path between the match line and the first voltage level according to a second compare result.

6. The CAM device of claim 1, wherein:

the first data storing circuit and the second data storing circuit comprise static random access memory cells.

7. The CAM circuit of 1, further including:

the CAM cells include a first CAM cell with a first data storing circuit and second data storing circuit, and a second CAM cell, physically adjacent to the first CAM cell, having an adjacent first data storing circuit and an adjacent second data storing circuit, wherein the first data storing circuit and adjacent first data storing circuit each comprise X-cells and the second data storing circuit and second adjacent data storing circuit each comprise Y-cells and the first data storing circuit and second data storing circuit are interleaved with the first adjacent data storing circuit and second adjacent data storing circuit within a same row of CAM cells.

\* \* \* \* \*